United States Patent
Yoshikawa

(10) Patent No.: US 6,380,586 B1
(45) Date of Patent: Apr. 30, 2002

(54) TRENCH-TYPE INSULATED GATE BIPOLAR TRANSISTOR

(75) Inventor: Koh Yoshikawa, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/498,928

(22) Filed: Feb. 4, 2000

(30) Foreign Application Priority Data

Feb. 5, 1999 (JP) ............................................ 11-028392

(51) Int. Cl.[7] ....................... H01L 29/76; H01L 29/94; H01L 31/062; H01L 31/113; H01L 31/119
(52) U.S. Cl. ..................... 257/330; 257/332; 257/565
(58) Field of Search ................................. 257/132, 133, 257/137, 329, 330, 331, 332, 378, 565, 587

(56) References Cited

U.S. PATENT DOCUMENTS

| | | | | |
|---|---|---|---|---|
| 5,283,201 A | * | 2/1994 | Tsang et al. ................ | 438/267 |
| 5,378,655 A | * | 1/1995 | Hutchings et al. .......... | 438/260 |
| 5,578,522 A | * | 11/1996 | Nakamura et al. .......... | 438/260 |
| 5,679,966 A | * | 10/1997 | Baliga et al. ............... | 257/139 |
| 5,821,580 A | * | 10/1998 | Kuwahara ................... | 257/330 |
| 6,121,089 A | * | 9/2000 | Zeng et al. ................. | 438/268 |
| 6,246,092 B1 | * | 6/2001 | Fujihira et al. ............. | 257/341 |
| 6,262,470 B1 | * | 7/2001 | Lee et al. ................... | 257/565 |

FOREIGN PATENT DOCUMENTS

JP 09260648-a * 10/1997

* cited by examiner

Primary Examiner—Olik Chaudhuri
Assistant Examiner—Hoai Pham
(74) Attorney, Agent, or Firm—Rossi & Associates

(57) ABSTRACT

A trench-type IGBT is disclosed that facilitates reducing the tradeoff relation between the saturation voltage and the turn-off loss. The trench-type IGBT's includes the following characteristic structures: (1) the drift layer of the first conductivity type has extended portions extended between the selectively formed well regions of the second conductivity type; (2) the well regions of the second conductivity type are formed selectively in the respective surface portions of the drift layer of the first conductivity type, and the doped regions of the first conductivity type, doped more heavily than the drift layer, are formed in the other surface portions of the drift layer, wherein the well regions are not formed; (3) the auxiliary gate electrode is disposed above the extended portion of the drift layer of the first conductivity type extended between p-type well regions or above the doped region of the first conductivity type with the auxiliary gate insulation film interposed therebetween; (4) the trenches include respective portions not surrounded by any well region of the second conductivity type nor by any emitter region of the first conductivity type; and (5) the ratio $W_t/W_p$ of the width $W_t$ of the trench and the width $W_p$ of the p-type well region is set at a value between 1 and 20.

21 Claims, 15 Drawing Sheets

TRENCH-TYPE INSULATED GATE BIPOLAR TRANSISTOR

FIELD OF THE INVENTION

The present invention relates to a trench-type insulated gate bipolar transistor (hereinafter referred to as a "trench-type IGBT") having a MOS gate, formed of a metal film, an oxide film and a semiconductor, buried in a trench in the surface portion of a semiconductor substrate.

BACKGROUND OF THE INVENTION

Insulated gate bipolar transistors (IGBT's) exhibit both the high breakdown voltage and high current characteristics of bipolar transistors and the high frequency characteristics of MOSFET's. Recently, the breakdown voltage and the capacity of the IGBT's have been increased, and some high power devices exhibiting a breakdown voltage of from 2500 to 4500 V and a current capacity of from several hundreds to 1800 A have been developed. These high power devices includes a module-type package or a flat package, in which multiple IGBT chips are mounted in parallel.

FIG. 19 is a cross sectional view of a conventional planar IGBT (hereinafter referred to as a "P-IGBT"). Referring now to FIG. 19, p-type well regions 2 are formed selectively from one of the major surfaces of a lightly doped (highly resistive) n-type drift layer 1. In the surface portion of p-type well region 2, n-type emitter regions 3 are formed selectively. A gate electrode 10 is formed above the extended portion of p-type well region 2 extended between n-type drift layer 1 and n-type emitter regions 3 with a gate oxide film 6 interposed therebetween. An emitter electrode 11 is in common contact with p-type well regions 2 and n-type emitter regions 3. A p-type collector layer 4 is formed on the other surface of n-type drift layer 1 with a heavily doped n-type buffer layer 5 interposed therebetween. The n-type buffer layer 5 is doped more heavily than n-type drift layer 1. A collector electrode 12 is in contact with p-type collector layer 4.

Now the operation of the P-IGBT is explained. In the turn-on mode, an inversion layer (hereinafter referred to as a "channel") is created in the surface portion of p-type well region 2 by applying a positive voltage higher than a certain threshold while collector electrode 12 is biased to be positive and emitter electrode 11 is biased to be negative (or grounded). Electrons are injected from n-type emitter region 3 to n-type drift layer 1 through the channel. The injected electrons lower the potential of n-type buffer layer 5 with respect to the potential of p-type collector layer 4. When the forward voltage across the pn junction between n-type buffer layer 5 and p-type collector layer 4 exceeds the barrier layer voltage of about 0.6 V, holes are injected from p-type collector layer 4 to n-type drift layer 1 via n-type buffer layer 5. The injected electrons and holes are accumulated in n-type drift layer 1 so that electrical neutrality may be realized. The accumulated electrons and holes modulate the conductivity of n-type drift layer 1, resulting in a very low resistance of n-type drift layer 1. The resulting very low resistance of n-type drift layer 1 switches the IGBT on. Hereinafter, the electrons and holes accumulated excessively in n-type drift layer 1 in the ON-state of the IGBT will be referred to as the "accumulated carriers". The holes injected from p-type collector layer 4 in the ON-state pass p-type well region 2 and flow out from emitter electrode 11 in contact with p-type well region 2.

The above described operation is the same with that of a pnp-transistor formed of a p-type collector layer 4, an n-type drift layer 1 and a p-type well region 2. The voltage drop between the collector and the emitter caused by a predetermined current (usually, the rated current) in the ON-state of the IGBT is called a "saturation voltage".

In the turn-off mode, the channel between n-type emitter region 3 and n-type drift layer 1 vanishes as the positive voltage applied to gate electrode 10 is reduced. As the channel between n-type emitter region 3 and n-type drift layer 1 vanishes, the electron injection from n-type emitter region 3 stops, and the holes injected from p-type collector layer 4 to n-type drift layer 1 via n-type buffer layer 5 decrease. The accumulated carriers in n-type drift layer 1 form pairs in n-type drift layer 1 and vanish. Or, the electrons flow out to collector electrode 12 via p-type collector layer 4, and the holes flow out to emitter electrode 11 via p-type well region 2. As all the accumulated carriers vanish, the resistance of n-type drift layer 1 becomes extremely high, resulting in an OFF-state of the IGBT. The loss caused during the period of transition from the ON-state to the OFF-state is called the "turn-off loss".

As described above, the ON-state and the OFF-state of the IGBT are determined by the behaviors of the electrons and the holes in n-type drift layer 1. When many carriers are accumulated in n-type drift layer 1 in the ON-state, the saturation voltage is low due to low resistance of n-type drift layer 1. However, since the accumulated carriers are too many to remove in turning-off, the turn-off loss is large. When few carriers are accumulated in n-type drift layer 1 in the ON-state, the turn-off loss is small, since the accumulated carriers to be removed are few. However, the saturation voltage is high due to high resistance of n-type drift layer 1.

Thus, there exists a tradeoff relation between the saturation voltage in the conductive state of the IGBT and the turn-off loss caused in turning-off of the IGBT, wherein the saturation voltage or the turn-off loss increases when the turn-off loss or the saturation voltage reduces. For applying IGBT's to semiconductor conversion apparatuses, it is important to reduce the tradeoff relation between the saturation voltage and the turn-off loss from the view point of reducing the heat loss.

Since the IGBT was invented in early eighties, various measures have been examined to reduce the tradeoff relation between the saturation voltage and the turn-off loss. Typical measures include a buffer layer disposed between a base layer and a collector layer, and a method of controlling the carrier life time in the base layer.

However, it is difficult to reduce the tradeoff relation between the saturation voltage and the turn-off loss only by changing the total amount of the electrons and the holes injected in n-type drift layer 1. The tradeoff relation may be reduced by changing the distributions of the electrons and the holes injected in semiconductor substrate 1. It has been pointed out for reducing the tradeoff relation that it is effective to increase the amount of the carrier accumulated on the side of the emitter electrode of the IGBT.

Recently, an IGBT (hereinafter referred to as a "T-IGBT"), that facilitates reducing the tradeoff relation by forming a MOS gate in a trench dug in the surface portion of a semiconductor substrate, has been proposed.

FIG. 20 is a cross sectional view of a conventional T-IGBT. Referring now to FIG. 20, p-type well regions 2 and n-type emitter regions 3 are formed from one of the major surfaces of a lightly doped n-type drift layer 1. A trench 7 extends from the surface of n-type emitter region 3 to n-type drift layer 1. A gate electrode 10 is buried in trench 7 with a gate oxide film 6 interposed therebetween. An n-type buffer layer 5 is on the other major surfaces of n-type drift layer 1, and a p-type collector layer 4 is on n-type buffer layer 5. An emitter electrode 11 is in common contact with n-type emitter regions 3 and p-type well regions 2. A collector electrode 12 is in contact with p-type collector layer 4.

The parameters of an exemplary T-IGBT, the rated voltage thereof is 4500 V and the rated current density thereof is 40 Acm$^{-2}$, are as follows. The specific resistance of n-type drift layer 1 is about 320 Ωcm. The thickness of n-type drift layer 1 is 490 μm. The depth of trench 7 is 6 μm. The short side length in the bottom portion of trench 7 is 2 μm. The spacing between adjacent trenches 7 is 10 μm. The surface impurity concentration of p-type well region 2 is $4\times10^{17}$ cm$^{-3}$. The depth of p-type well region 2 is 5 μm. The surface impurity concentration of n-type emitter region 3 is $1\times10^{20}$ cm$^{-3}$. The depth of the n-type emitter region 3 is about 0.5 μm. The width of n-type emitter region 3 is 1 μm. The thickness of gate insulation film 6 is 80 nm. The thickness of insulation film 8 is about 1 μm. A life time killer is doped in a part of n-type drift layer 1. The saturation voltage of the T-IGBT is about 6.3 V at the current density of 40 Acm$_{-2}$ and at the temperature of 125° C.

The principles of turning-on and turning-off of the T-IGBT is the same with those of the P-IBGT.

However, since the channels are created in the P-IGBT on the emitter electrode side rather than on the side of the pn-junctions between n-type drift layer 1 and p-type well regions 2, depletion layers expanding from the pn-junctions narrow the current path (sometimes referred to as the "J-FET effect"), raising the saturation voltage. Due to the J-FET effect, the tradeoff relation between the saturation voltage and the turn-off loss is more hazardous for the P-IGBT. In contrast, since the channels are created in the T-IGBT on the collector electrode side rather than on the side of the pn-junctions between n-type drift layer 1 and p-type well regions 2, any J-FET effect is not caused.

Therefore, the T-IGBT is advantageous to reduce the tradeoff relation between the saturation voltage and the turn-off loss, since the T-IGBT facilitates reducing the saturation voltage without increasing the turn-off loss.

Since it is necessary to increase the specific resistance and the thickness of n-type drift layer 1 so that the high breakdown voltage of the IGBT may be sustained, the tradeoff relation between the saturation voltage and the turn-off loss becomes worse in the P-IGBT as the breakdown voltage thereof increases than in the T-IGBT.

The p-type well regions 2 in contact with emitter electrode 11 occupy a wider area on the side of emitter electrode 11 in the T-IGBT than in the P-IGBT. Due to this, the holes injected from p-type collector layer 4 tend to diffuse and flow to emitter electrode 11, lowering the accumulated carrier concentration on the side of emitter electrode 11. Therefore, there exists a certain leeway for further reducing the tradeoff relation between the saturation voltage and the turn-off loss.

An injection-enhancement-type insulated gate bipolar transistor (IEGT) and a T-IGBT, including p-type well regions not in electrical contact with an emitter electrode, have been reported as the examples which reduce the tradeoff relation between the saturation voltage and the turn-off loss by increasing the accumulated carrier concentration on the side of emitter electrode 11. However, the reported IEGT and T-IGBT having complicated structures are not suited for mass-production.

In view of the foregoing, it is an object of the invention to provide a trench-type IGBT (T-IGBT) that facilitates reducing the tradeoff relation between the saturation voltage and the turn-off loss by increasing the accumulated carrier concentration on the side of the emitter electrode by a simple structure.

SUMMARY OF THE INVENTION

According to an aspect of the present invention, there is provided a trench-type insulated gate bipolar transistor including: a drift layer of a first conductivity type; well regions of a second conductivity type in the surface portion of the drift layer; emitter regions of the first conductivity type in the respective well regions; trenches extending from the emitter regions to the drift layer; gate electrodes, each thereof being buried in each of the trenches with a gate insulation film interposed therebetween; an emitter electrode in common contact with the emitter regions and the well regions; a collector layer of the second conductivity type on the back surface of the drift layer; a collector electrode on the collector layer; the well regions being formed selectively; and the drift layer including extended portions extended between the well regions.

By leaving the portions, wherein the well regions are not formed, in the major surface of the drift layer, the holes injected from the collector layer are prevented from diffusing and flowing out from the emitter electrode, increasing the accumulated carrier concentration on the side of the emitter electrode. The conductivity modulation is enhanced more with increasing accumulated carrier concentration and, as a result, the saturation voltage is reduced.

Advantageously, doped regions of the first conductivity type, doped more heavily than the drift layer, are formed in the portions, wherein the well regions are not formed, of the major surface of the drift layer.

By disposing the doped regions, the holes injected from the collector layer are prevented from diffusing and flowing out from emitter electrode. The injected holes neutralize the electrons in the doped regions. And, the hole concentration in the vicinity of the doped regions is increased, further increasing the accumulated carrier concentration. Due to the combined effects, the accumulated carrier concentration is increased in a wide area on the side of the emitter electrode.

Advantageously, the surface impurity concentration of the doped regions is $1\times10^{16}$ cm$^{-3}$ or less.

The surface impurity concentration of $1\times10^{16}$ cm$^{-3}$ or less is not enough to reverse the conductivity type of the well regions. However, the surface impurity concentration of $1\times10^{16}$ cm$^{-3}$ or less is enough to induce a sufficient amount of holes to increase the hole concentration in the vicinity of the doped regions.

Advantageously, auxiliary gate electrodes are disposed above the respective extended portions of the drift layer extended between the well regions or above the respective doped regions with respective auxiliary gate insulation films interposed therebetween.

By biasing the auxiliary gate electrodes at a positive potential in the ON-state and at zero or a negative potential in the OFF-state, electrons are accumulated in the surface portions of the drift layer beneath the auxiliary gate electrodes. The holes injected from the collector layer are attracted to the portions, wherein the electrons are accumulated, by the Coulomb force, resulting in a high hole concentration. Thus, the accumulated carrier concentration is further increased.

By connecting the gate electrodes with the respective auxiliary gate electrodes, the auxiliary gate electrodes may be biased at a positive potential in the ON-state, and one power supply may be used to apply a bias voltage.

When the trenches have respective portions not surrounded by any well region nor by any emitter region, electrons are accumulated in the surface portions of the side walls of the trenches by applying a voltage to the gate electrodes in the respective trenches. The accumulated electrons increase the hole concentration, further increasing the accumulated carrier concentration.

Advantageously, the trenches are shaped with respective stripes, and the well regions are shaped with respective stripes extending in perpendicular to the stripes of the trenches.

By arranging the stripe-shaped trenches and the stripe-shaped well regions as described above, it is easy to provide the trenches with the portions not surrounded by any well region nor by any emitter region.

Advantageously, the stripe of the well region is divided into rectangles spaced apart form each other by the stripes of the trenches.

Advantageously, the emitter regions are shaped with respective rectangles extending in parallel to the stripes of the trenches.

Advantageously, the emitter regions are shaped with respective rectangles extending in perpendicular to the stripes of the trenches.

Advantageously, the stripe of the trench is divided into rectangles terminated by the well regions, and the emitter regions are arranged along the short sides of the rectangular trenches.

Any of the above described arrangements facilitates providing the trenches with the portions not surrounded by any well region nor by any emitter region.

Advantageously, the ratio $W_t/W_p$ of the bottom width $W_t$ of the trench and the width $W_p$ of the well region between the trenches is set at a value between 1 and 20.

By setting the ratio $W_t/W_p$ as described above, electrons are attracted below the trenches and the hole injected from the collector layer are attracted to the portions, wherein the electrons are accumulated, further increasing the accumulated carrier concentration.

When the ratio $W_t/W_p$ is less than 1, electrons are not accumulated below the trenches similarly as in the conventional T-IGBT. The ratio $W_t/W_p$ of more than 20 is not practical, since the number of the trenches in a unit area is so small that the channel resistance components increase.

BRIEF DESCRIPTION OF THE DRAWING FIGURES

DETAILED DESCRIPTION OF THE PREFERRED EMBODIMENTS OF THE INVENTION

Figure 19:
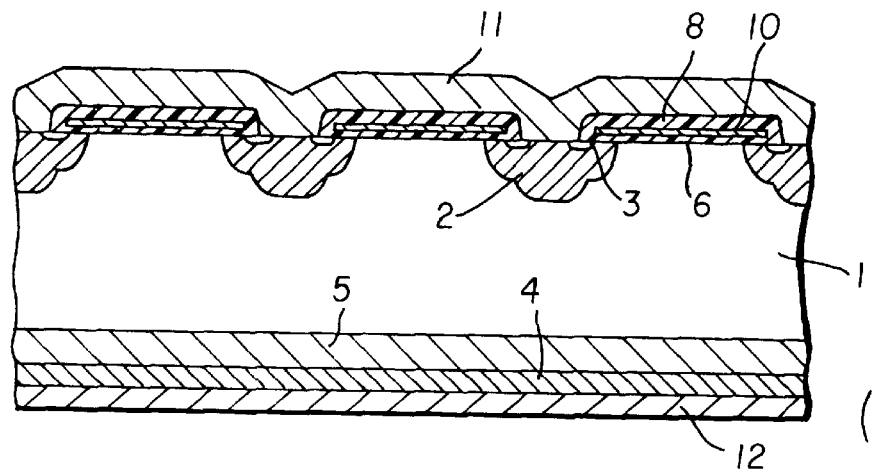
FIG. 19 is a cross sectional view of a conventional planar IGBT (P-IGBT).
Figure 20:
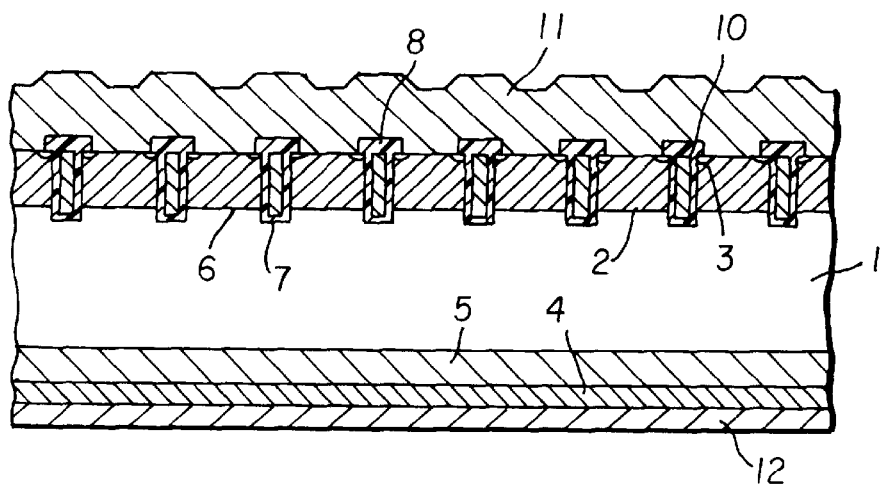
FIG. 20 is a cross sectional view of a conventional trench-type IGBT (T-IGBT).

Now the present invention will be explained in detail hereinafter with reference to the accompanied figures which illustrate the preferred embodiments of the invention. In these figures, the same reference numerals as used in FIGS. 19 and 20 are used for identifying the same components. Electrons are majority carries in the regions and layers identified by "n-type", and holes are majority carries in the regions and layers identified by "p-type".

First Embodiment

Figure 1:
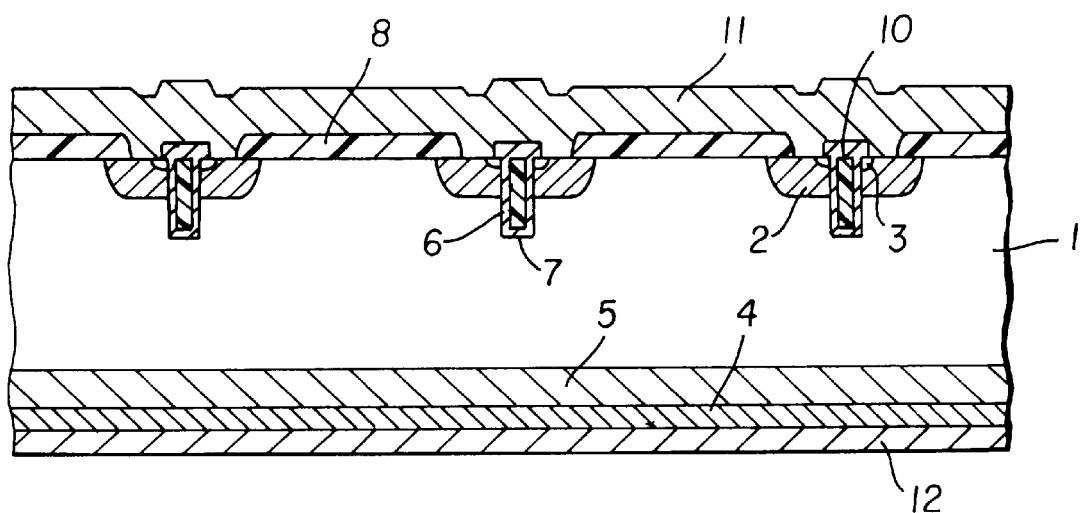
FIG. 1 is a cross sectional view of a T-IGBT (A1-type T-IGBT) according to a first embodiment of the invention.

FIG. 1 is a cross sectional view of a T-IGBT (hereinafter referred to as an "A1-type T-IGBT") according to a first embodiment of the invention. All the T-IGBT's including the A1-type one according to the invention exemplarily exhibit the rated voltage of 4500 V and the rated current density of 40 Acm$^{-2}$.

Referring now to FIG. 1, trenches 7 are formed from one of the major surfaces of an n-type drift layer 1, the specific resistance thereof is 320 Ωcm and the thickness thereof is 490 μm. The trenches 7 are 6 μm in depth, 2 μm in bottom short side length and spaced apart for 100 μm from each other. A p-type well region 2 is formed in parallel to and in contact with each trench 7. The p-type well region 2 is 10 μm in width and 5 μm in depth. In the surface portion of each p-type well region 2 , n-type emitter regions 3, each thereof is 1 μm in width and 0.5 μm in depth, are formed. The p-type well regions 2 are formed, for example, by implanting boron ions and by diffusing the implanted boron ions thermally. The n-type emitter regions 3 are formed, for example, by implanting phosphorous ions and by diffusing the implanted phosphorous ions thermally. The surface impurity concentration is $4 \times 10^{17}$ cm$^{-3}$ for p-type well regions 2 and $1 \times 10^{20}$ cm$^{-3}$ for n-type emitter regions 3. A gate insulation film 6 is formed in trench 7 by depositing an oxide film of 80 nm in thickness on the inner surface of trench 7. A polycrystalline silicon gate electrode 10 is formed on gate insulation film 6 in trench 7. An insulation film 8 of boron phosphorous silica glass and about 1 μm in thickness covers the major surface except a part of the surfaces of n-type emitter regions 3 and p-type well regions 2. An emitter electrode 11 is in contact with n-type emitter regions 3 and p-type well regions 2 through the windows bored through insulation film 8. In many cases, emitter electrode 11 is extended over insulation film 8 as shown in FIG. 1. On the other major surface of n-type drift layer 1, a p-type collector layer 4 is formed with an n+-type buffer layer 5 interposed therebetween. A collector electrode 12 is formed on p-type collector layer 4. The n+-type buffer layer 5 is doped more heavily than n-type drift layer 1. The n+-type buffer layer 5 and p-type collector layer 4 are formed, for example, by implanting respective impurity ions and by thermally diffusing the implanted impurity ions. The maximum impurity concentration in n+-type buffer layer 5 is $2 \times 10^{17}$ cm$^{-3}$. The thickness of n+-type buffer layer 5 is 5 μm. The surface impurity concentration of p-type collector layer 4 is $2 \times 10^{19}$ cm$^{-3}$. The thickness of p-type collector layer 4 is 1 μm. A metal gate terminal is in contact with gate electrodes 10 in the not-illustrated portion of FIG. 1.

The A1-type T-IGBT of FIG. 1 is different from the T-IGBT of FIG. 20 in that p-type well regions 2 are formed selectively and n-type drift layer 1 is extended between p-type well regions 2 in the A1-type T-IGBT. The width of the extended portion of n-type drift layer 1 is 80 μm.

When the turn-off loss of the A1-type T-IGBT is about 400 mJ, the saturation voltage is about 6.2 V at the current density of 40 Acm$^{-2}$ and at the temperature of 125° C. Thus, the tradeoff relation between the saturation voltage and the turn-off loss is reduced by the A1-type T-IGBT according to the first embodiment. All the other T-IGBT's according to the invention will be evaluated also by comparing the saturation voltages thereof at the same turn-off loss.

Figure 5:
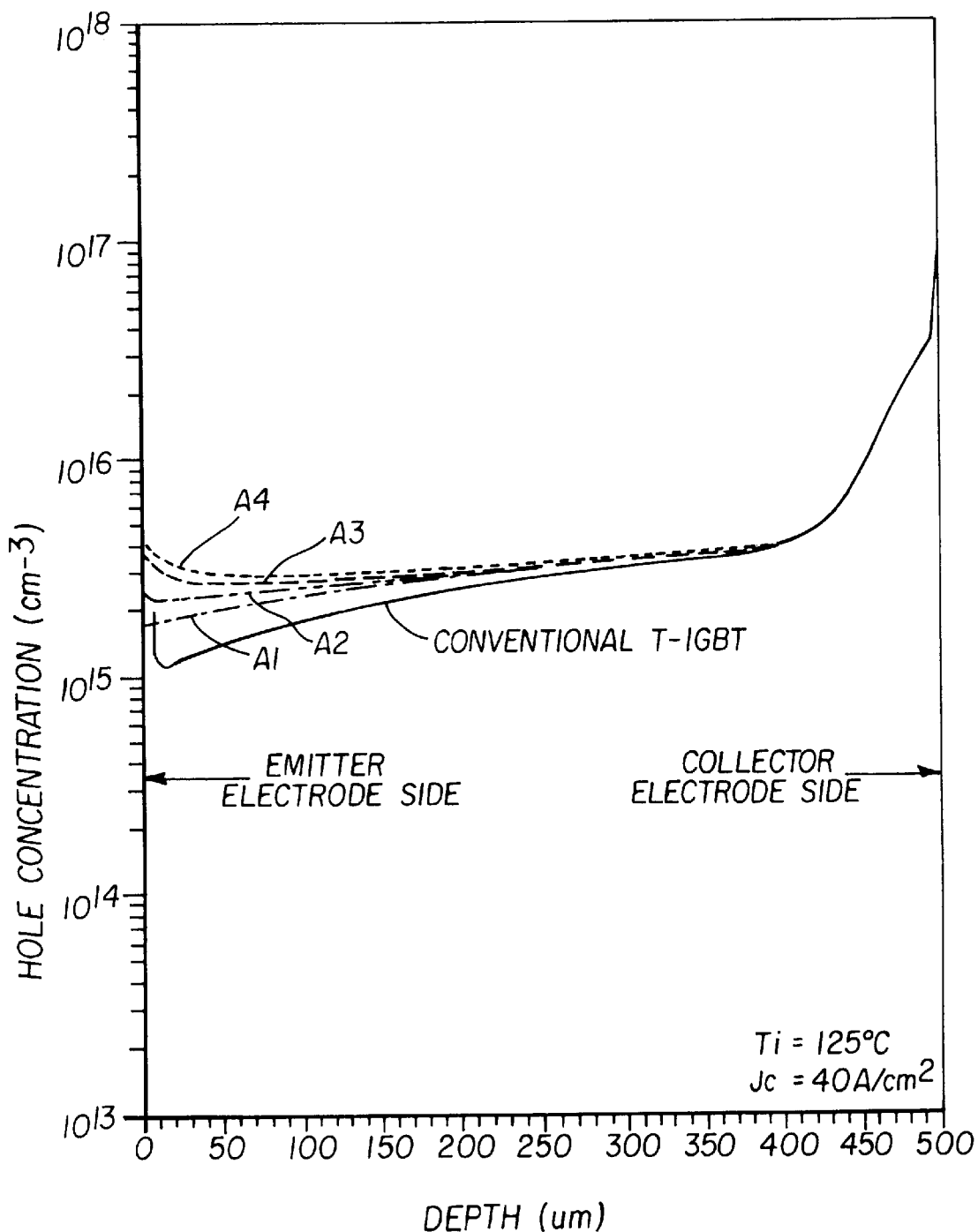
FIG. 5 shows a set of curves for comparing the hole distributions in the T-IGBT's according to the invention with the hole distribution in the conventional T-IGBT.

FIG. 5 shows a set of curves for comparing the hole distributions in the T-IGBT's according to the first through fourth embodiments of the invention with the hole distribution in the conventional T-IGBT. The vertical axis in the figure represents the logarithmic hole concentration and the horizontal axis the depth from the semiconductor surface. The left hand side of the figure corresponds to the emitter electrode and the right hand side the collector electrode. The dimensions and the parameters of the exemplary T-IGBT's are the same with those of the T-IGBT according to the first embodiment. The hole distributions shown in FIG. 5 are obtained by simulation under the rated current density of 40 Acm$^{-2}$ and at the temperature of 125° C.

As FIG. 5 indicates, the hole concentration in the A1-type T-IGBT according to the first embodiment is higher on the side of the emitter electrode than that in the conventional T-IGBT. Since almost the same amount of electrons exists due to the neutral condition, the accumulated carrier concentration is high in n-type drift layer 1. Thus, conductivity modulation is caused in n-type drift layer 1, resulting in a low saturation voltage for the IGBT. By virtue of the resulting low saturation voltage, the tradeoff relation between the saturation voltage and the turn-off loss is reduced.

Second Embodiment

Figure 2:
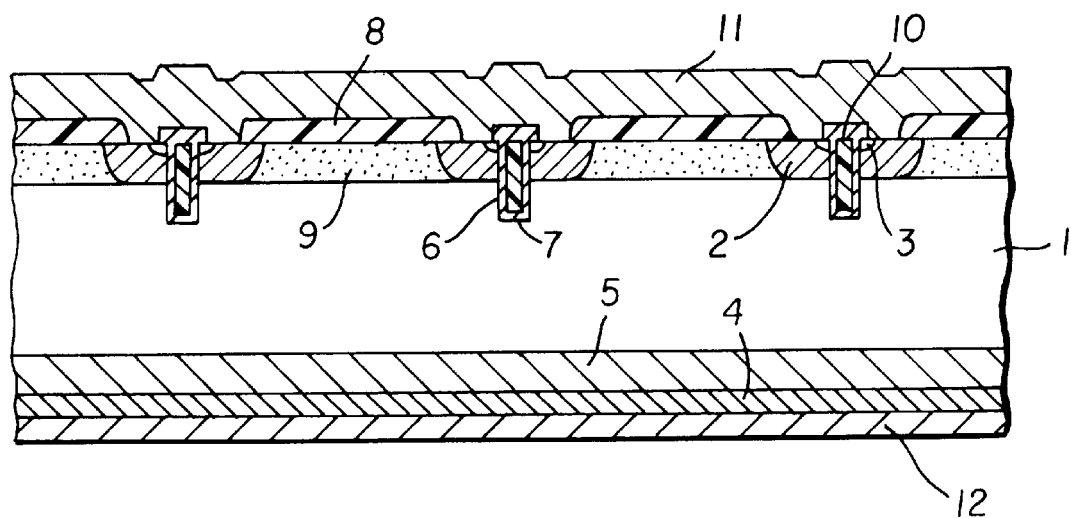
FIG. 2 is a cross sectional view of a T-IGBT (A2-type T-IGBT) according to a second embodiment of the invention.

FIG. 2 is a cross sectional view of a T-IGBT (hereinafter referred to as an "A2-type T-IGBT") according to a second embodiment of the invention. Referring now to FIG. 2, the A2-type T-IGBT according to the second embodiment is different from the A1-type T-IGBT according to the first embodiment in that heavily doped n+-type doped regions 9 are in the portions of the major surface between p-type well regions 2. The n+-type doped regions 9 are doped more heavily than n-type drift layer 1. The n+-type doped regions 9 are formed, for example, by implanting impurity ions and by diffusing the implanted ions thermally. The surface impurity concentration of the n+-type doped region 9 is $1.0 \times 10^{15}$ cm$^{-3}$ and the depth thereof is about 5 μm. Since the surface impurity concentration of p-type well regions 2 is two orders of magnitude higher than the surface impurity concentration of n+-type doped regions 9, p-type well regions 2 are not converted to n-type ones.

When the turn-off loss of the A2-type T-IGBT is about 400 mJ, the saturation voltage is about 6.0 V at the current density of 40 Acm$^{-2}$ and at the temperature of 125° C.

The hole distribution in the A2-type T-IGBT obtained by simulation under the rated current density of 40 Acm$^{-2}$ and at the temperature of 125° C. is shown in FIG. 5. Referring now to FIG. 5, the hole concentration in the A2-type T-IGBT is higher than that in the A1-type T-IGBT on the left hand side of the figure to neutralize the electrons in n+-type doped regions 9. Due to the higher hole concentration, the accumulated carrier concentration is higher in n-type drift layer 1, resulting in a saturation voltage lower than that of the A1-type T-IGBT.

Third Embodiment

Figure 3:
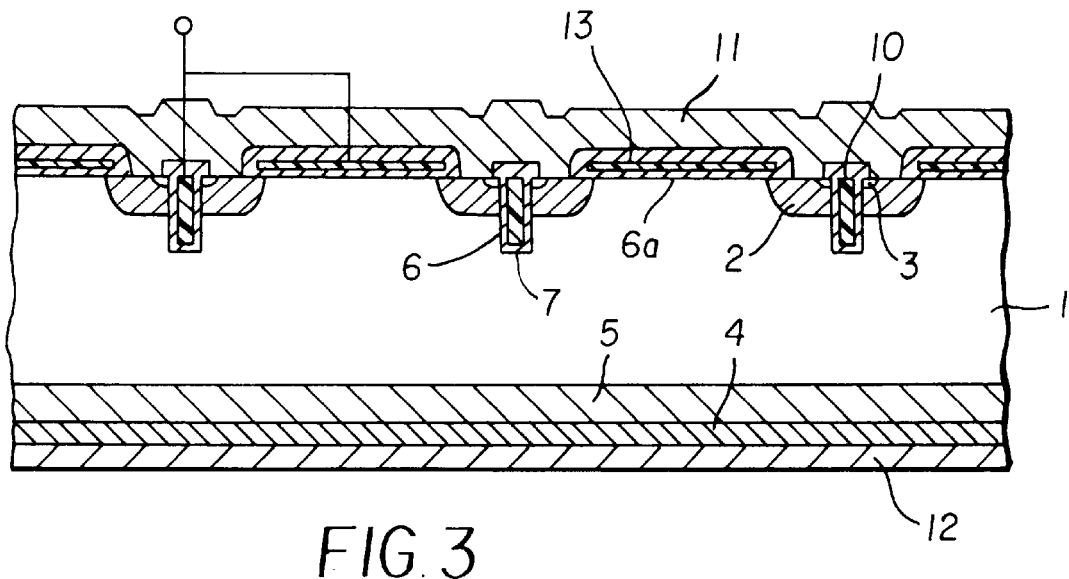
FIG. 3 is a cross sectional view of a T-IGBT (A3-type T-IGBT) according to a third embodiment of the invention.

FIG. 3 is a cross sectional view of a T-IGBT (hereinafter referred to as an "A3-type T-IGBT") according to a third embodiment of the invention. Referring now to FIG. 3, the A3-type T-IGBT according to the third embodiment is different from the A1-type T-IGBT according to the first embodiment in that an auxiliary gate electrode 13 of polycrystalline silicon and 1 μm in thickness is disposed above the extended portion of an n-type drift layer 1 extended between p-type well regions 2 with an auxiliary gate insulation film 6a of oxide and 80 nm in thickness interposed therebetween. Auxiliary gate electrode 13 is electrically connected to a gate electrode 10.

When the turn-off loss of the A3-type T-IGBT is about 400 mJ, the saturation voltage is about 5.7 V at the current density of 40 Acm$^{-2}$ and at the temperature of 125° C.

The hole distribution in the A3-type T-IGBT obtained by simulation under the rated current density of 40 Acm$^{-2}$ and at the temperature of 125 ° C. is shown in FIG. 5. Referring now to FIG. 5, the hole concentration in the A3-type T-IGBT is higher than that of the A2-type T-IGBT on the left hand side of the figure due to the holes for neutralizing the electrons accumulated under the auxiliary gate electrode 13. Due to the higher hole concentration, the accumulated carrier concentration is high in n-type drift layer 1, resulting in a saturation voltage lower than that of the A2-type T-IGBT. By virtue of the resulting low saturation voltage, the tradeoff relation between the saturation voltage and the turn-off loss is reduced.

Fourth Embodiment

Figure 4:
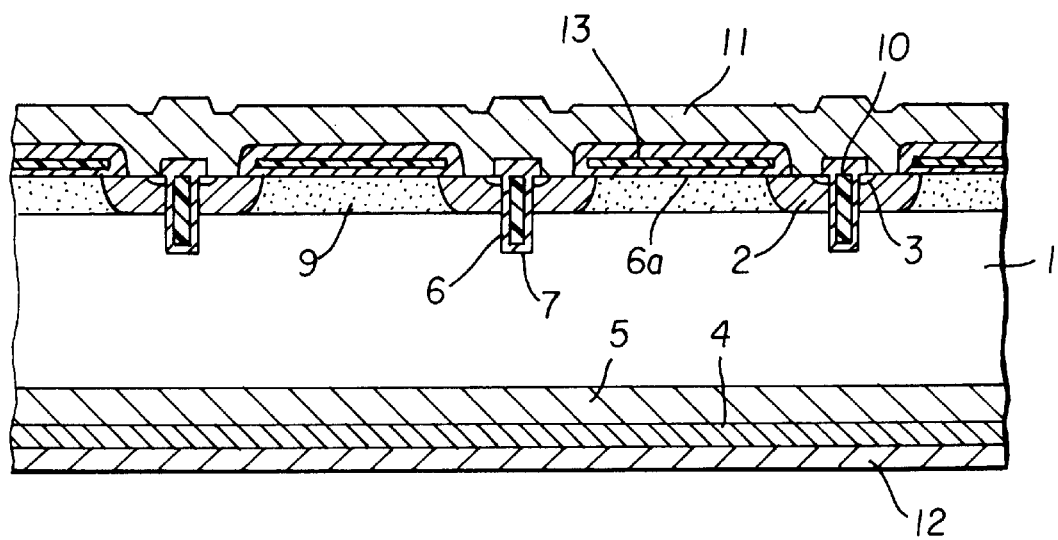
FIG. 4 is a cross sectional view of a T-IGBT (A4-type T-IGBT) according to a fourth embodiment of the invention.

FIG. 4 is a cross sectional view of a T-IGBT (hereinafter referred to as an "A4-type T-IGBT") according to a fourth embodiment of the invention. Referring now to FIG. 4, the A4-type T-IGBT has a structure obtained by integrating the structures of the A2-type T-IGBT and the A3-type T-IGBT.

When the turn-off loss of the A4-type T-IGBT is about 400 mJ, the saturation voltage is about 5.5 V at the current density of 40 Acm$^{-2}$ and at the temperature of 125° C.

The hole distribution in the A4-type T-IGBT obtained by simulation under the rated current density of 40 Acm$^{-2}$ and at the temperature of 125 ° C. is shown in FIG. 5. Referring now to FIG. 5, the hole concentration in the A4-type T-IGBT is higher than that of the A3-type T-IGBT due to the combined effects of the A2-type T-IGBT and the A3-type T-IGBT. Due to the high hole concentration, the accumulated carrier concentration is high in n-type drift layer 1, resulting in a saturation voltage lower than that of A3-type T-IGBT.

Table 1 compares the saturation voltages of the T-IGBT's of A1- through A4-types according to the invention and the conventional T-IGBT at the rated current density of 40 Acm$^{-2}$ and at the temperature of 125° C.

TABLE 1

| T-IGBT's | Saturation voltage (V) (40 Acm$^{-2}$ 125° C.) |
| --- | --- |
| A1-type | 6.2 |
| A2-type | 6.0 |
| A3-type | 5.7 |
| A4-type | 5.5 |
| Conventional | 6.3 |

The A2-type T-IGBT that has n+-type doped regions 9 and the A3-type T-IGBT that has auxiliary gate electrodes 13 effectively reduce the saturation voltage. The A4-type T-IGBT that integrates the structures of the A2-type T-IGBT and the A3-type T-IGBT further reduces the saturation voltage.

As FIG. 5 clearly shows, the accumulated carrier concentration on the surface side increases with lowering of the saturation voltage in the order of A1-type T-IGBT, A2-type T-IGBT, A3-type T-IGBT and A4-type T-IGBT.

Fifth Embodiment

Figure 6A:
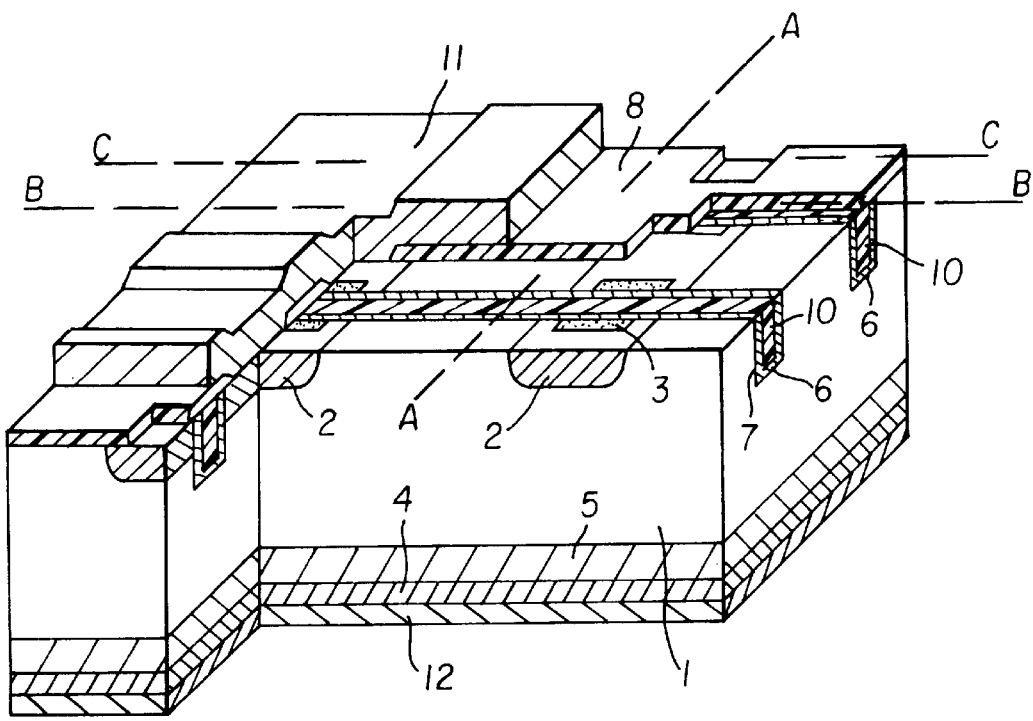
FIG. 6(a) is a perspective view of a T-IGBT (B11-type T-IGBT) according to a fifth embodiment of the invention.
Figure 6B:
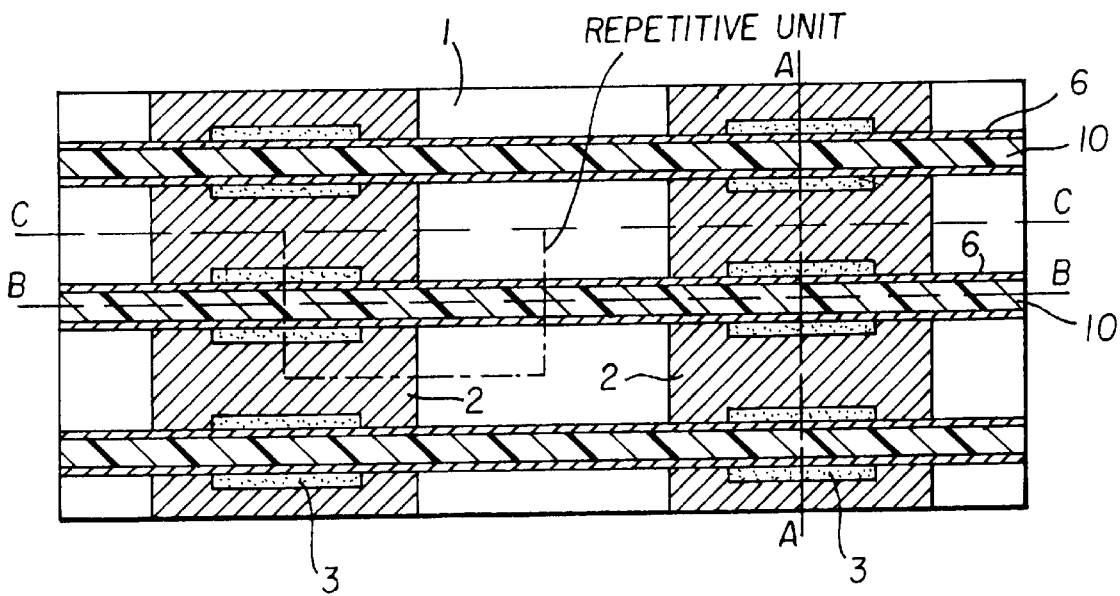
FIG. 6(b) is a top plan view of the T-IGBT of FIG. 6(a).
Figure 7A:
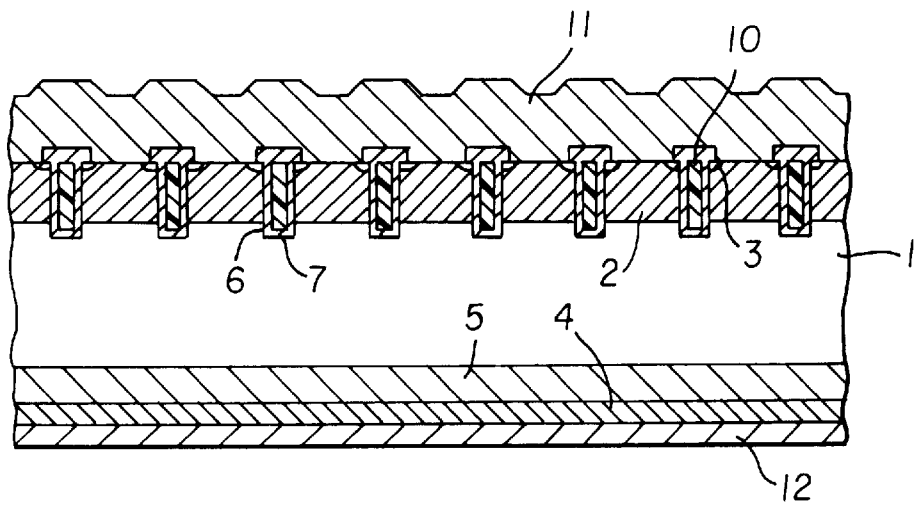
FIG. 7(a) is a cross section A in FIGS. 6(a) and 6(b).
Figure 7B:
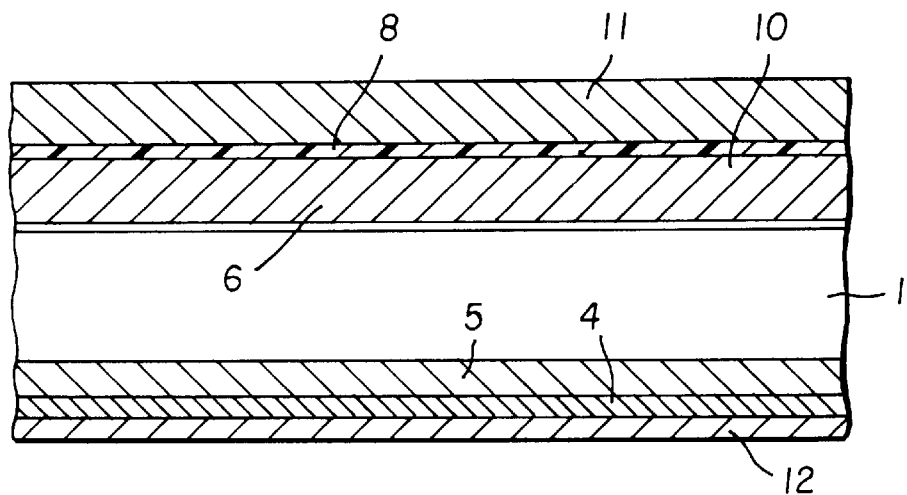
FIG. 7(b) is a cross section B in FIGS. 6(a) and 6(b).
Figure 7C:
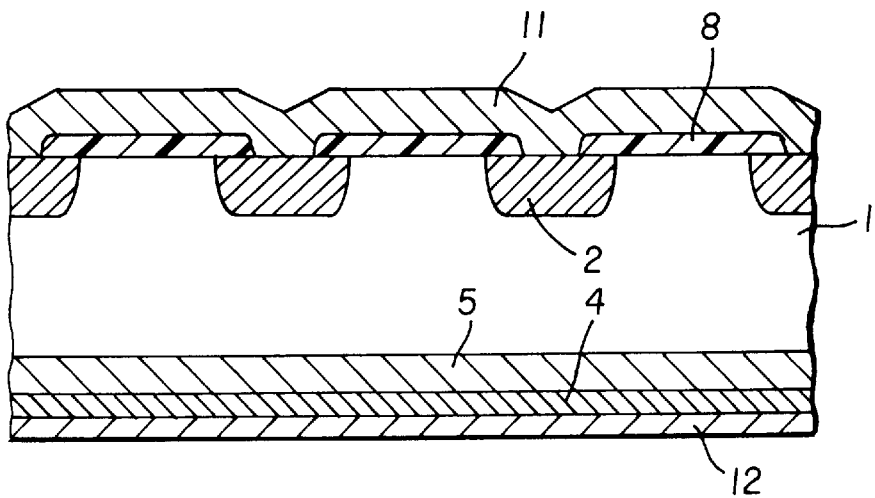
FIG. 7(c) is a cross section C in FIGS. 6(a) and 6(b).

FIG. 6(a) is a perspective view of a T-IGBT (hereinafter referred to as a "B11 -type T-IGBT") according to a fifth embodiment of the invention. FIG. 6(b) is a top plan view of the T-IGBT of FIG. 6(a). FIG. 7(a) is a cross section A in FIGS. 6(a) and 6(b). FIG. 7(b) is a cross section B in FIGS. 6(a) and 6(b). FIG. 7(c) is a cross section C in FIGS. 6(a) and 6(b).

Referring now to FIGS. 6(a) and 6(b), trenches 7 are formed from one of the major surfaces of an n-type drift layer 1, the specific resistance thereof is 320 Ωcm. The trenches 7 are 6 m in depth, 2 μm in bottom short side length and spaced apart for 10 μm from each other. In perpendicular to trench 7, p-type well regions 2 are formed. The p-type well regions 2 are 20 μm in width, 5 μm in depth and spaced apart for 80μm from each other. In the surface portion of each p-type well region 2, n-type emitter regions 3, each thereof is 1 μm in width, 10 μm in length and 0.5 μm in depth, are formed. A gate insulation film 6 is formed in trench 7 by depositing an oxide film of 80 nm in thickness on the inner surface of trench 7. A polycrystalline silicon gate electrode 10 is formed on gate insulation film 6 in trench 7. An insulation film 8 of boron phosphorous silica glass and about 1 m in thickness covers the major surface except a part of the surfaces of n-type emitter regions 3 and p-type well regions 2. An emitter electrode 11 is in contact with n-type emitter regions 3 and p-type well regions 2 through the windows bored through insulation film 8. In many cases, emitter electrode 11 is extended over insulation film 8 as shown in FIG. 6(a). On the other major surface of n-type drift layer 1, a p-type collector layer 4 is formed with an n+-type buffer layer 5 interposed therebetween. A collector electrode 12 is formed on p-type collector layer 4.

As shown in FIG. 6(b), trenches 7 and p-type well regions 2 extends in perpendicular to each other. The n-type emitter regions 3 extends in parallel to trenches 7.

The cross section A shown in FIG. 7(a) is the same with the cross sectional view of the T-IGBT shown in FIG. 20. The p-type well regions 2 occupy all the spaces between trenches 7. The cross section B shown in FIG. 7(b) is a cross section along trenches 7, that is the same with the cross section along trenches 7 of the conventional T-IGBT. In the cross section C shown in FIG. 7(c), p-type well regions 2 are separated from each other, illustrating a difference from the conventional T-IGBT.

When the turn-off loss of the B11-type T-IGBT is about 400 mJ, the saturation voltage is about 4.8 V at the current density of 40 Acm$^{-2}$ and at the temperature of 125 ° C. In the B11-type T-IGBT, electrons are accumulated in the portions of n-type drift layer 1, in contact with trenches 7, wherein gate electrodes 10 are buried, and not having any p-type well region 2 formed therein. In association with the electron accumulation, the hole concentration increases, resulting in an increased carrier concentration in n-type drift layer 1. The increased carrier concentration in n-type drift layer 1 reduces the saturation voltage.

Sixth Embodiment

Figure 8:
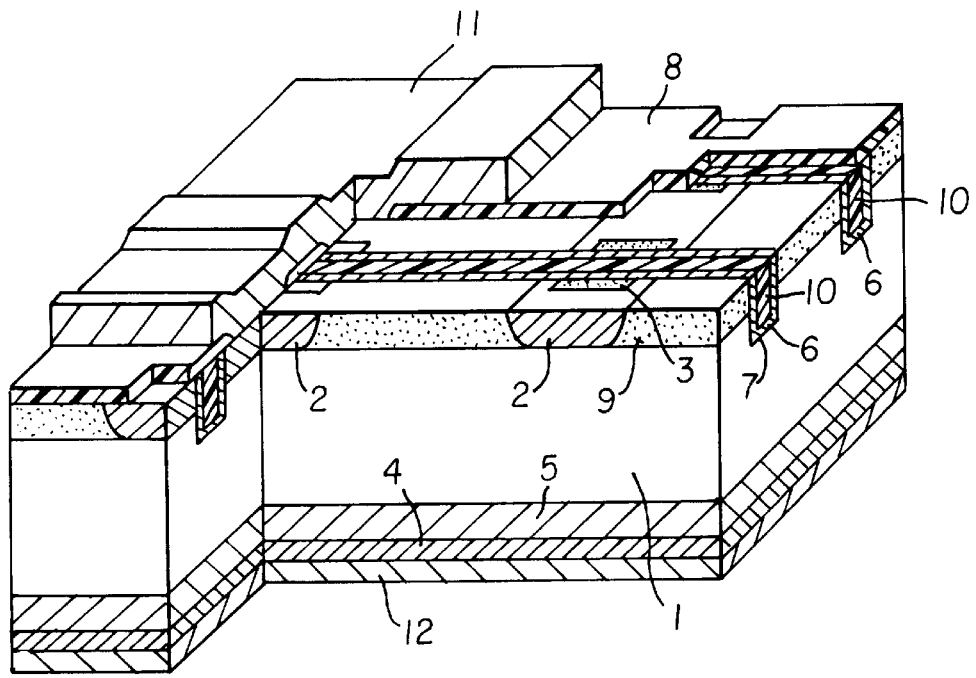
FIG. 8 is a perspective view of a T-IGBT (B12-type T-IGBT) according to a sixth embodiment of the invention.

FIG. 8 is a perspective view of a T-IGBT (hereinafter referred to as a "B12-type T-IGBT") according to a sixth embodiment of the invention. The B12-type T-IGBT is different from the foregoing B11-type T-IGBT in that n+-type doped regions 9 are in the portions of the major surface surrounded by p-type well regions 2 and trenches 7. The surface impurity concentration of n+-type doped region 9 is 1.0×10$^{15}$ cm$^{-3}$ and the depth thereof is 5 μm.

The saturation voltage of the B12-type T-IGBT is about 4.5 V at the current density of 40 Acm$^{-2}$ and at the temperature of 125° C. The further reduced saturation voltage, lower than that of the B11-type T-IGBT, is attributed to the accumulated carrier concentration in n-type drift layer 1 increased by the mechanism explained earlier in connection with the saturation voltage of the A2-type T-IGBT.

Seventh Embodiment

Figure 9:
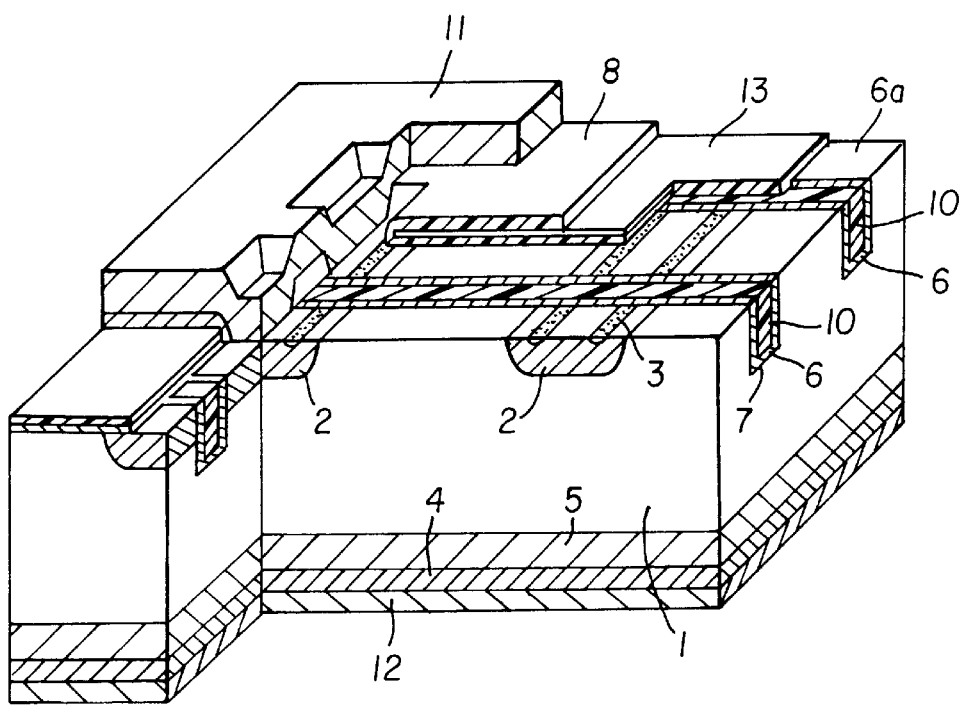
FIG. 9 is a perspective view of a T-IGBT (B13-type T-IGBT) according to a seventh embodiment of the invention.

FIG. 9 is a perspective view of a T-IGBT (hereinafter referred to as a "B13-type T-IGBT") according to a seventh embodiment of the invention. Referring now to FIG. 9, the B13-type T-IGBT is different from the B11-type T-IGBT in that an auxiliary gate electrode 13 of polycrystalline silicon and 1 m in thickness is disposed above the extended portion of an n-type drift layer 1 extended between p-type well regions 2 with an auxiliary gate insulation film 6a of oxide and 80 nm in thickness interposed therebetween. Auxiliary gate electrode 13 is electrically connected to a gate electrode 10. As shown in FIG. 9, n-type emitter regions 3 may be extended in perpendicular to trenches 7 and in parallel to p-type well regions 2.

The saturation voltage of the B13-type T-IGBT is about 4.2 V at the current density of 40 Acm$^{-2}$ and at the temperature of 125° C. The further reduced saturation voltage, lower than that of the B12-type T-IGBT, is attributed to the accumulated carrier concentration in n-type drift layer 1 increased by the mechanism explained earlier in connection with the saturation voltage of the A3-type T-IGBT.

Eighth Embodiment

Figure 10:
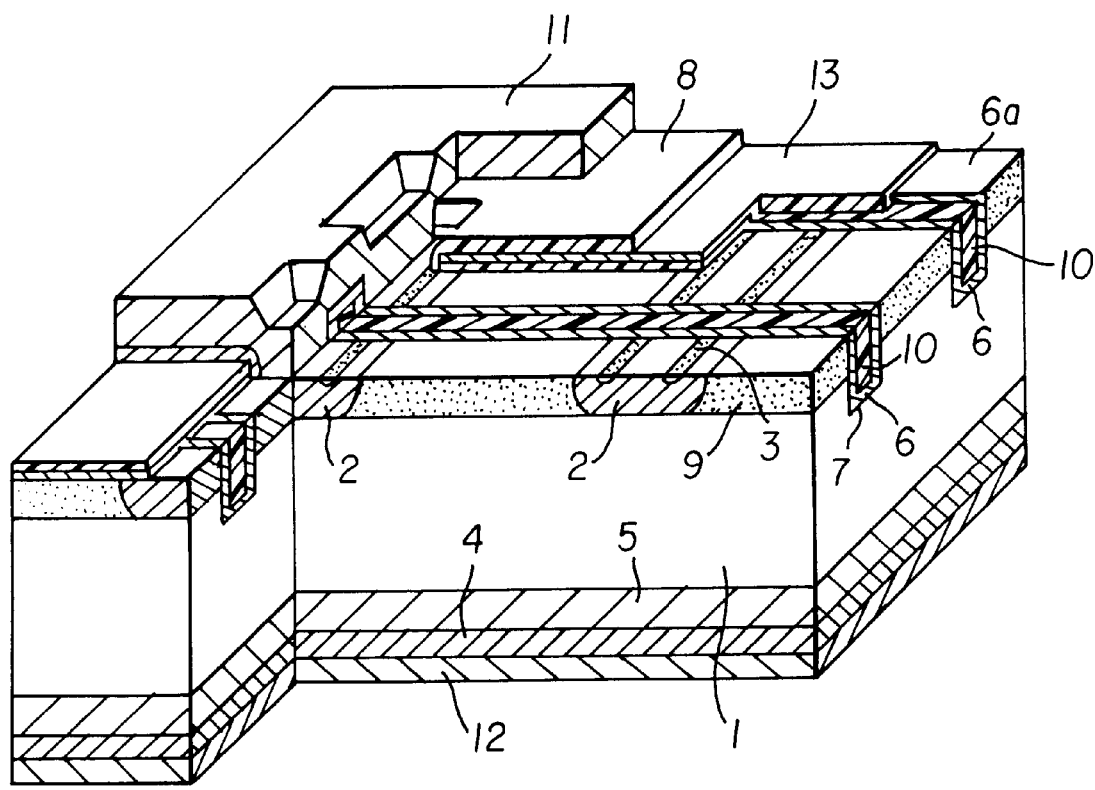
FIG. 10 is a perspective view of a T-IGBT (B14-type T-IGBT) according to an eighth embodiment of the invention.

FIG. 10 is a perspective view of a T-IGBT (hereinafter referred to as a "B14-type T-IGBT") according to an eighth embodiment of the invention. Referring now to FIG. 10, the B14-type T-IGBT has a structure obtained by integrating the structures of the B12-type T-IGBT and the B13-type T-IGBT. In the entire surface portions surrounded by p-type well regions 2 and trenches 7, n+-type doped regions 9 are formed. The surface impurity concentration of n+-type doped region 9 is $1.0 \times 10^{15}$ cm$^{-3}$ and the depth thereof is about 5μm. An auxiliary gate electrode 13 of 1 μm in thickness is disposed above n+-type doped region 9 with an auxiliary gate insulation film 6a of 80 nm in thickness interposed therebetween. Auxiliary gate electrode 13 is electrically connected to a gate electrode 10.

The saturation voltage of the B14-type T-IGBT is about 4.0 V at the current density of 40 Acm$^{-2}$ and at the temperature of 125° C. The accumulated carrier concentration in the B14-type T-IGBT is higher due to the combined effects of the B12-type T-IGBT and the B13-type T-IGBT, resulting in a saturation voltage lower than that of the B13-type T-IGBT.

Ninth Embodiment

Figure 11A:
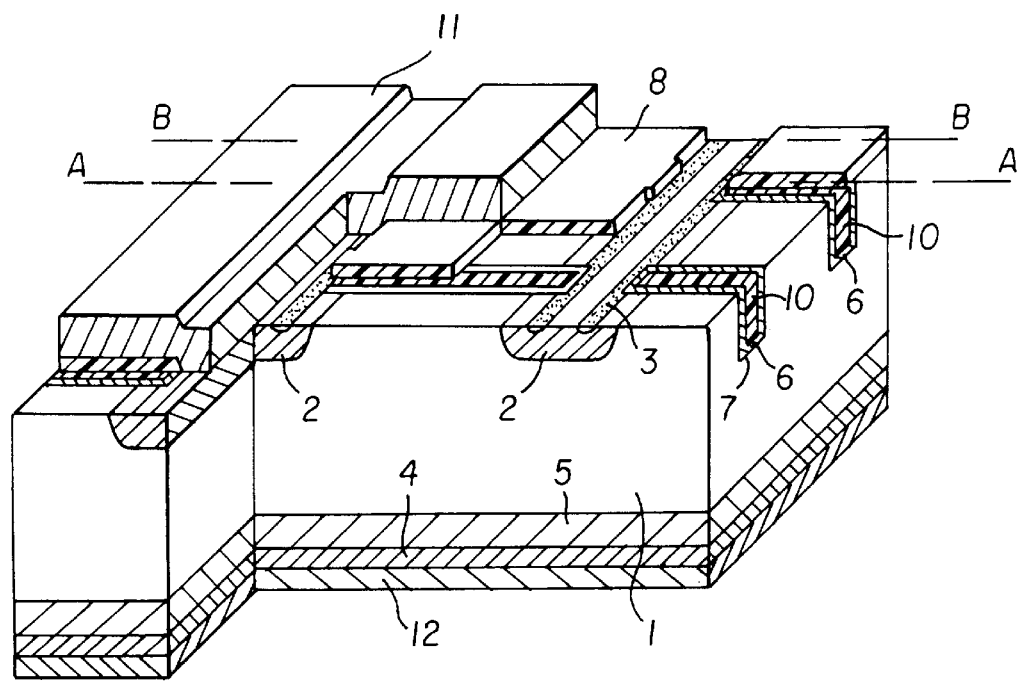
FIG. 11(a) is a perspective view of a T-IGBT (B21-type T-IGBT) according to a ninth embodiment of the invention.
Figure 11B:
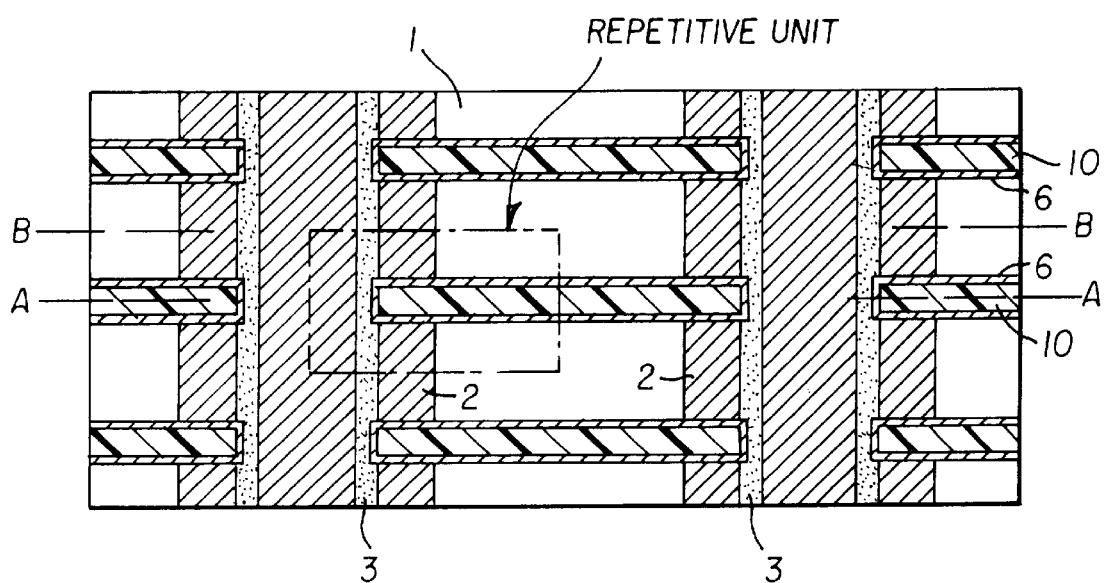
FIG. 11(b) is a top plan view of the T-IGBT of FIG. 11(a).
Figure 12A:
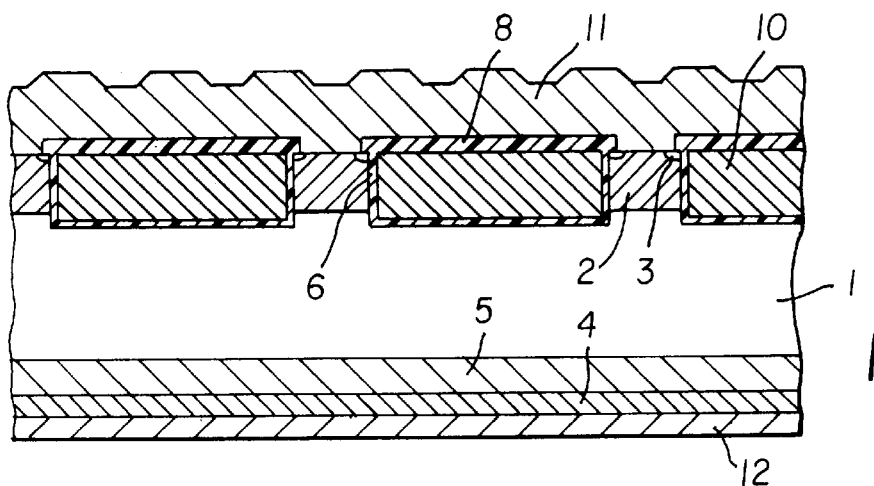
FIG. 12(a) is a cross section A in FIGS. 11(a) and 11(b).
Figure 12B:
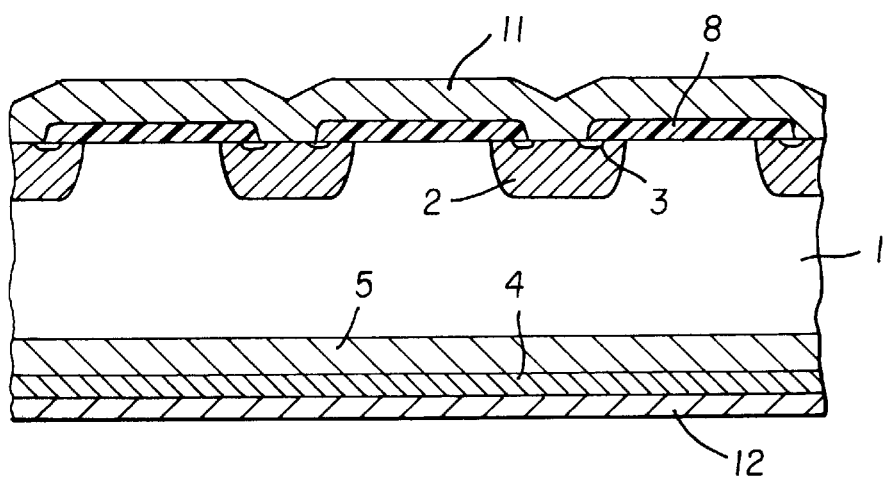
FIG. 12(b) is a cross section B in FIGS. 11(a) and 11(b).

FIG. 11(a) is a perspective view of a T-IGBT (hereinafter referred to as a "B21-type T-IGBT") according to a ninth embodiment of the invention. FIG. 11(b) is a top plan view of the T-IGBT of FIG. 11(a). FIG. 12(a) is a cross section A in FIGS. 11(a) and 11(b). FIG. 12(b) is a cross section B in FIGS. 11(a) and 11(b).

Referring now to FIGS. 11(a) and 11(b), trenches 7 are formed from one of the major surfaces of an n-type drift layer 1, the specific resistance thereof is 320 Ωcm. The trenches 7 are 6 μm in depth, 2 μm in bottom short side length, 25 μm in bottom long side length, and spaced apart for 10 μm from each other. In contact with the short sides of trenches 7, p-type well regions 2 are formed. The p-type well region 2 is 10 μm in width and 5 μm in depth. In the surface portion of each p-type well region 2, n-type emitter regions 3, each thereof is 1 μm in width and 0.5 μm in depth, are formed. A gate insulation film 6 is formed in trench 7 by depositing an oxide film of 80 μm in thickness on the inner surface of trench 7. A polycrystalline silicon gate electrode 10 is formed on gate insulation film 6 in trench 7. An insulation film 8 of boron phosphorous silica glass and about 1 μm in thickness covers the major surface except a part of the surfaces of n-type emitter regions 3 and p-type well regions 2. An emitter electrode 11 is in contact with n-type emitter regions 3 and p-type well regions 2. In many cases, emitter electrode 11 is extended over insulation film 8 as shown in FIG. 11(a). On the other major surface of n-type drift layer 1, a p-type collector layer 4 is formed with an n+-type buffer layer 5 interposed therebetween. A collector electrode 12 is formed on p-type collector layer 4.

As shown in FIG. 11(b), trenches 7 and p-type well regions 2 extend in perpendicular to each other. The n-type emitter regions 3 of the B21-type T-IGBT extend, in the manner different from those of the B11-type T-IGBT, also in perpendicular to trenches 7.

The cross section A shown in FIG. 12(a) is a cross section along the long sides of trench 7, illustrating trenches 7 spaced apart from each other. Between trenches 7, p-type well regions 2 are formed. In FIG. 12(b), p-type well regions 2 spaced apart from each other and n-type emitter regions 3 in the surface portion of each p-type well region 2 are shown.

The saturation voltage of the B21-type T-IGBT is about 5.1 V at the current density of 40 Acm$^{-2}$ and at the temperature of 125° C. In the B21-type T-IGBT, electrons are accumulated in the portions of n-type drift layer 1, in contact with trenches 7, wherein gate electrodes 10 are buried, and not having any p-type well region 2 formed therein. In association with the electron accumulation, the hole concentration increases, increasing the accumulated carrier concentration in n-type drift layer 1. The increasing carrier concentration in n-type drift layer 1 reduces the saturation voltage.

Tenth Embodiment

Figure 13:
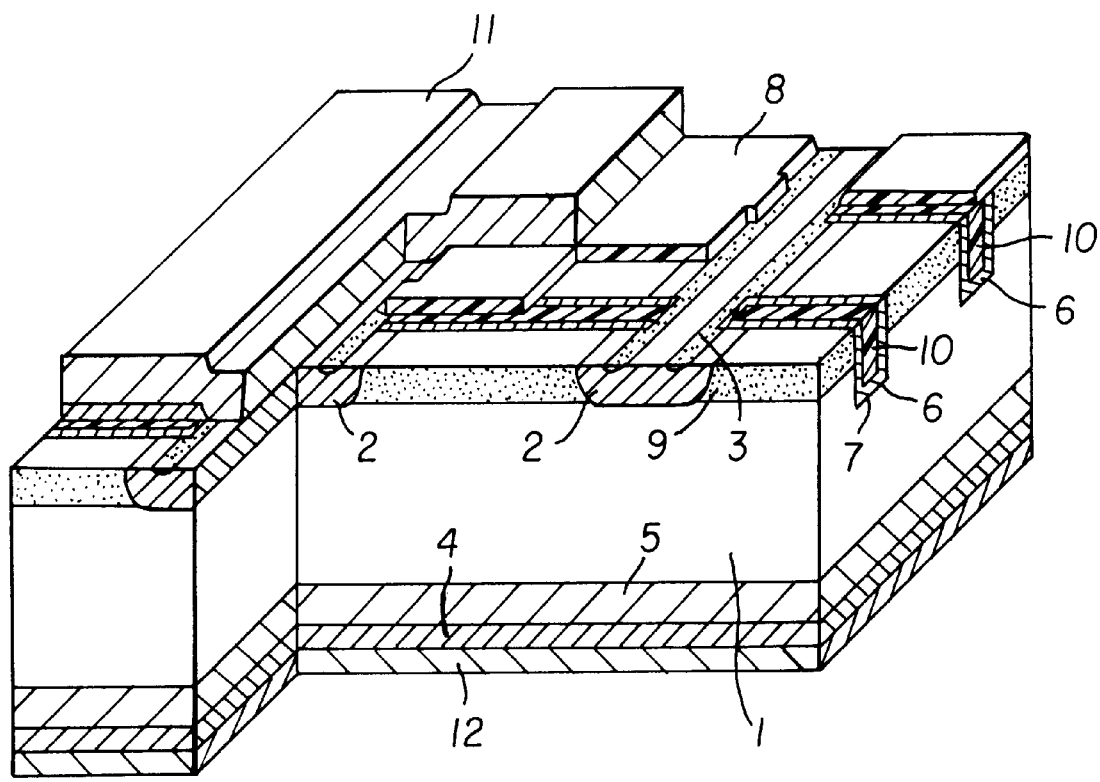
FIG. 13 is a perspective view of a T-IGBT (B22-type T-IGBT) according to a tenth embodiment of the invention.

FIG. 13 is a perspective view of a T-IGBT (hereinafter referred to as a "B22-type T-IGBT") according to a tenth embodiment of the invention. The B22-type T-IGBT is different from the foregoing B21-type T-IGBT in that n+-type doped regions 9 are in the portions of the major surface surrounded by p-type well regions 2 and trenches 7. The surface impurity concentration of n+-type doped region 9 is $1.0 \times 10^{15}$ cm$^{-3}$ and the depth thereof is about 5 μm.

The saturation voltage of the B22-type T-IGBT is about 4.8 V at the current density of 40 Acm$^{-2}$ and at the temperature of 125° C. The further reduced saturation voltage, lower than that of the B21-type T-IGBT, is attributed to the accumulated carrier concentration in n-type drift layer 1 increased by the mechanism explained earlier in connection with the saturation voltage of the A2-type T-IGBT.

Eleventh Embodiment

Figure 14:
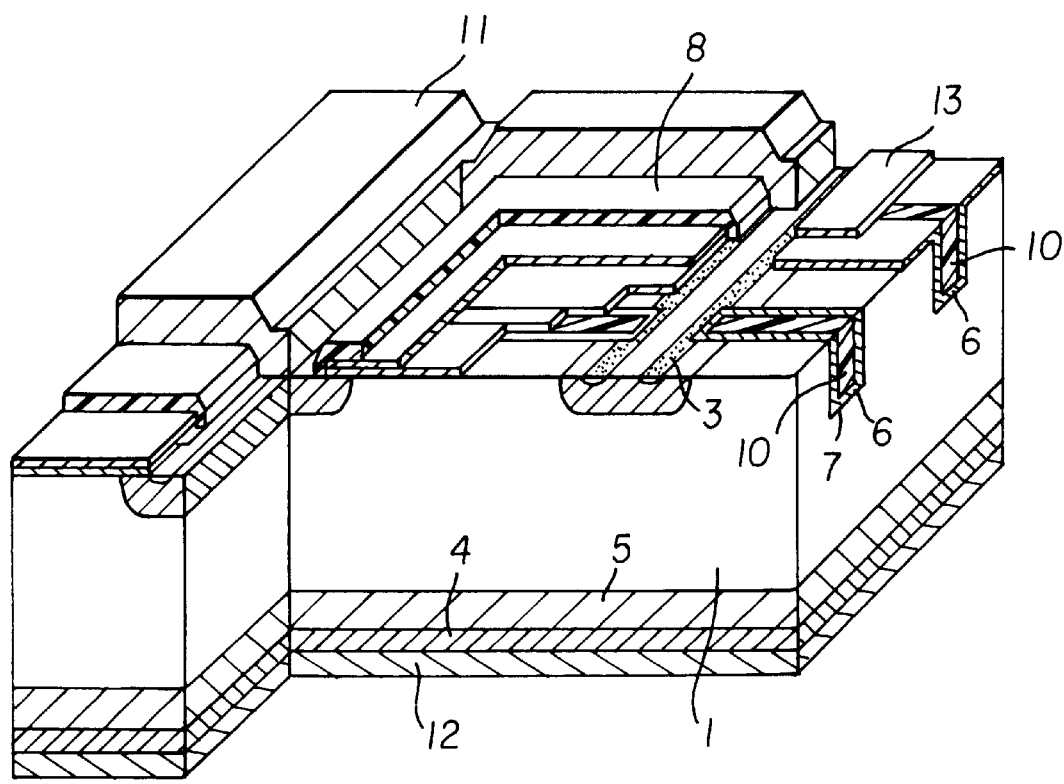
FIG. 14 is a perspective view of a T-IGBT (B23-type T-IGBT) according to an eleventh embodiment of the invention.

FIG. 14 is a perspective view of a T-IGBT (hereinafter referred to as a "B$^{23}$-type T-IGBT") according to an eleventh embodiment of the invention. Referring now to FIG. 14, the B23-type T-IGBT is different from the B$^{21}$-type T-IGBT in that an auxiliary gate electrode 13 of 1 μm in thickness is disposed above the extended portion of an n-type drift layer 1 extended between p-type well regions 2 with an auxiliary oxide gate insulation film 6a of 80 nm in thickness interposed therebetween. Auxiliary gate electrode 13 is electrically connected to a gate electrode 10.

The saturation voltage of the B23-type T-IGBT is about 4.6 V at the current density of 40 Acm$^{-2}$ and at the temperature of 125° C. The further reduced saturation voltage, lower than that of the B22-type T-IGBT, is attributed to the accumulated carrier concentration in n-type drift layer 1 increased by the mechanism explained earlier in connection with the saturation voltage of the A3-type T-IGBT.

Twelfth Embodiment

Figure 15:
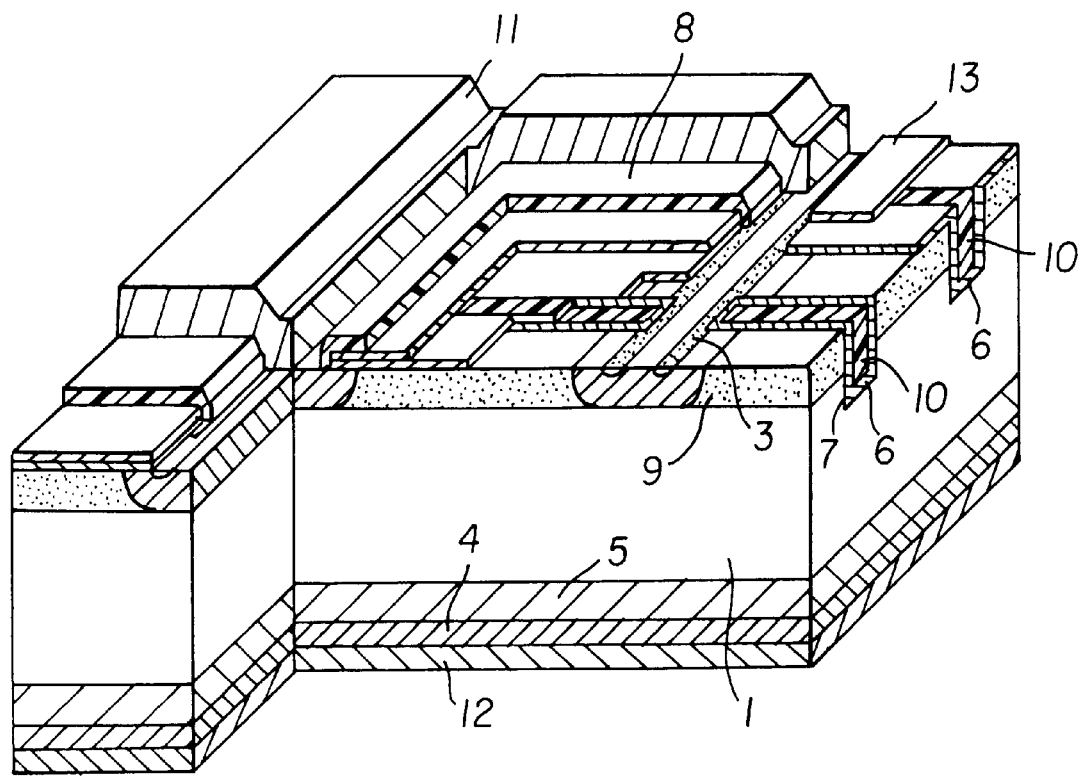
FIG. 15 is a perspective view of a T-IGBT (B24-type T-IGBT) according to a twelfth embodiment of the invention.

FIG. 15 is a perspective view of a T-IGBT (hereinafter referred to as a "B24-type T-IGBT") according to a twelfth embodiment of the invention. Referring now to FIG. 15, the B24-type T-IGBT has a structure obtained by integrating the structures of the B22-type T-IGBT and the B23-type T-IGBT. In the surface portions surrounded by p-type well regions 2 and trenches 7, n+-type doped regions 9 are formed. The surface impurity concentration of n+-type doped region 9 is $1.0 \times 10^{15}$ cm$^{-3}$ and the depth thereof is about 511m. An auxiliary gate electrode 13 of 1 μm in thickness is disposed above n+-type doped region 9 with an auxiliary oxide gate insulation film 6a of 80 nm in thickness interposed therebetween. Auxiliary gate electrode 13 is electrically connected to a gate electrode 10.

The saturation voltage of the B24-type T-IGBT is about 4.4 V at the current density of 40 Acm$^{-2}$ and at the temperature of 125° C. The accumulated carrier concentration in the B24-type T-IGBT is higher due to the combined effects of the B22-type T-IGBT and the B$^2$3-type T-IGBT, resulting in a saturation voltage lower than that of the B23-type T-IGBT.

Table 2 compares the saturation voltages of the T-IGBT's of B11-through B14-types and of B21-through B24-types according to the invention at the rated current density of 40 Acm$^{-2}$ and at the temperature of 125° C.

TABLE 2

| T-IGBT's | Saturation voltage (V) (40 Acm$^{-2}$, 125° C.) |
| --- | --- |
| B11-type | 4.8 |
| B12-type | 4.5 |
| B13-type | 4.2 |
| B14-type | 4.0 |
| B21-type | 5.1 |
| B22-type | 4.8 |
| B23-type | 4.6 |
| B24-type | 4.4 |

The saturation voltages of the B-type T-IGBT's according to the invention are lower than the saturation voltage of the conventional T-IGBT. The n+-type doped regions 9, auxiliary gate electrodes 13 and a combination of n+-type doped regions 9 and auxiliary gate electrodes 13 are effective to reduce the saturation voltage.

Thirteenth Embodiment

Figure 16:
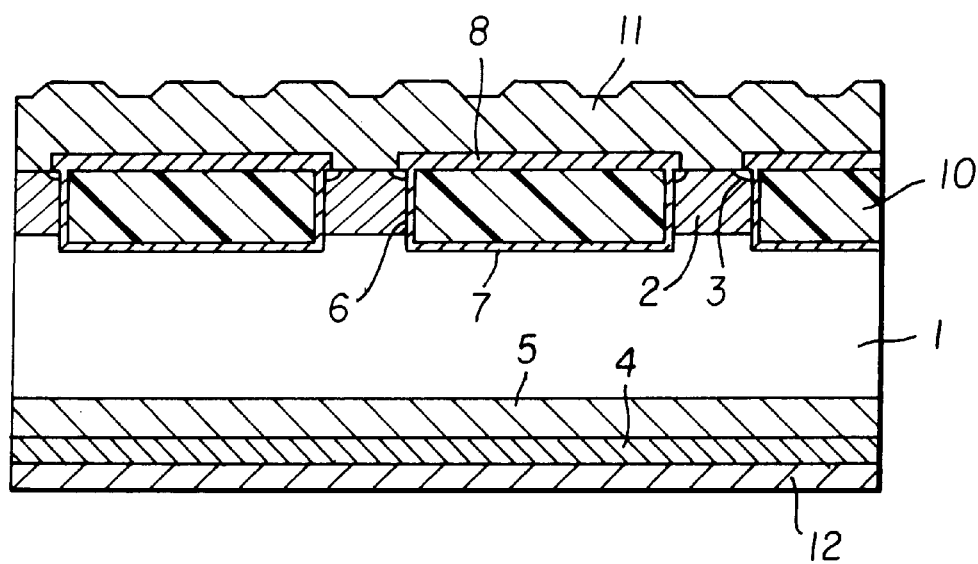
FIG. 16 is a cross sectional view of a T-IGBT (C1-type T-IGBT) according to a thirteenth embodiment of the invention.

FIG. 16 is a cross sectional view of a T-IGBT (hereinafter referred to as a "C1-type T-IGBT") according to a thirteenth embodiment of the invention.

Referring now to FIG. 13, trenches 7 are formed from one of the major surfaces of an n-type drift layer 1, the specific resistance thereof is 320 Ωcm. The trenches 7 are 6 μm in depth, 25 μm in bottom short side length and spaced apart for 5 μm from each other. Between trench 7, p-type well regions 2 of 5 μm in depth are formed. In the surface portion of each p-type well region 2, n-type emitter regions 3, each thereof is 1 μm in width and 0.5 m in depth, are formed. A gate insulation film 6 is formed in trench 7 by depositing an oxide film of 80 nm in thickness on the inner surface of trench 7. A polycrystalline silicon gate electrode 10 is formed on gate insulation film 6 in trench 7. An insulation film 8 of boron phosphorous silica glass and about 1 m in thickness covers the major surface except a part of the surfaces of n-type emitter regions 3 and p-type well regions 2. An emitter electrode 11 is in contact with n-type emitter regions 3 and p-type well regions 2. In many cases, emitter electrode 11 is extended over insulation film 8 as shown in FIG. 11(a). On the other major surface of n-type drift layer 1, a p-type collector layer 4 is formed with an n+-type buffer layer 5 interposed therebetween. A collector electrode 12 is formed on p-type collector layer 4.

Some experimental T-IGBT's are fabricated by changing the bottom width of trenches 7 from 2.5 to 45.0 μm while fixing the width of p-type well regions 2 at 5 μm.

Figure 17:
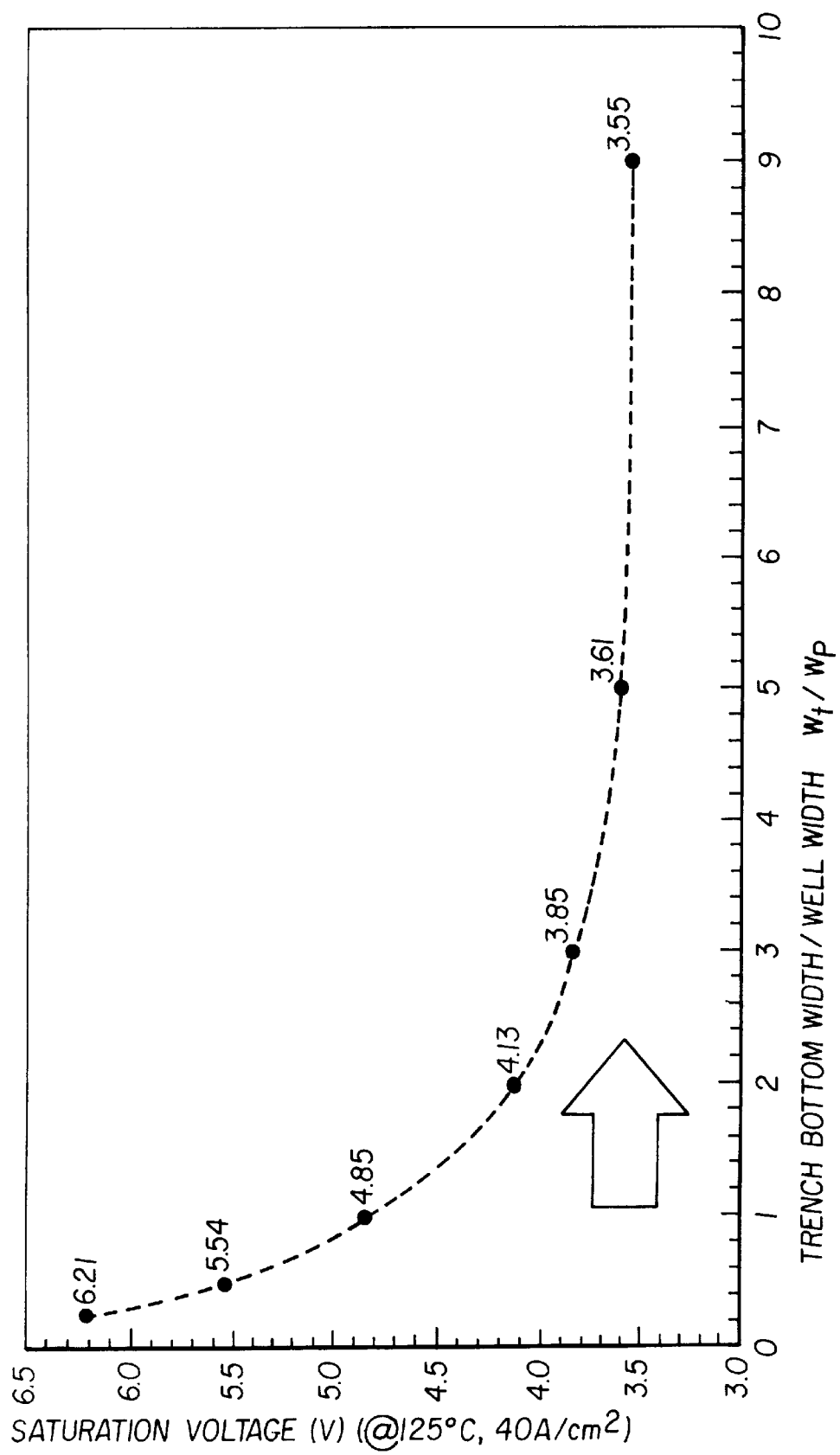
FIG. 17 is a graph showing a curve for relating the saturation voltage with the bottom width of the trench.

FIG. 17 is a graph showing a curve for relating the saturation voltage with the bottom width of the trench. In FIG. 17, the vertical axis represents the saturation voltage at the current density of 40 Acm$^{-2}$ and at the temperature of 125° C., and the horizontal axis represents the ratio $W_t/W_p$ of the bottom width $W_t$ of trench 7 and the width $W_p$ of p-type well region 2.

At the ratio $W_t/W_p$ equal to or more than 1, that is when the bottom width of trench 7 is 5.0 μm or wider, the saturation voltage is reduced effectively. The ratio $W_t/W_p$ for the conventional T-IGBT is around 0.25.

Figure 18:
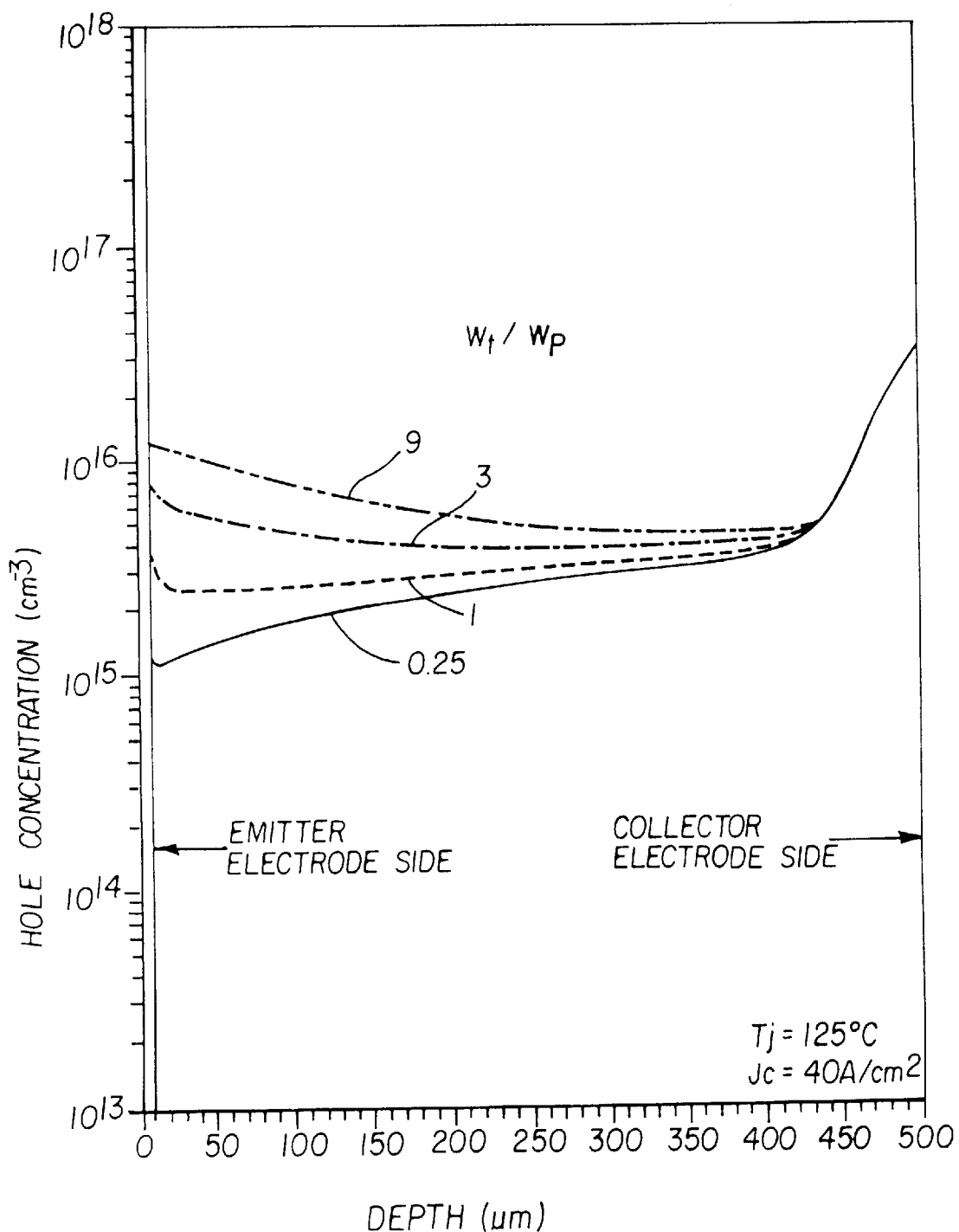
FIG. 18 shows a set of curves for comparing the hole concentration distributions in some exemplary T-IGBT's with the ratio of the widths of the trench and the well region as a parameter.

FIG. 18 is a graph showing a set of curves for comparing the hole concentration distributions in some exemplary T-IGBT's including the C1-type one with the ratio $W_t/W_p$ as a parameter. The vertical axis represents the logarithmic hole concentration and the horizontal axis represents the depth from the surface. The hole concentration distributions are obtained by simulation under the rated current density of 40 Acm$^{-2}$ and at the temperature of 125° C. FIG. 18 indicates that the hole concentration in the semiconductor is higher with increasing $W_t/W_p$ ratio. Thus, the saturation voltage reduces with increasing hole concentration.

Although the embodiments of the invention have been described in connection with n-channel insulated gate bipolar transistors, the present invention is applicable also to p-channel insulated gate bipolar transistors, wherein the conductivity types in the n-channel insulated gate bipolar transistors are exchanged to each other, with no problem.

As explained above, the tradeoff relation between the saturation voltage and the turn-off loss of the trench-type insulated gate bipolar transistor, having a gate electrode buried in a trench with a gate insulation film interposed therebetween, is reduced by the following structures.

(1) The drift layer of the first conductivity type has extended portions extended between the selectively formed well regions of the second conductivity type.

(2) The well regions of the second conductivity type are formed selectively in the respective surface portions of the drift layer of the first conductivity type, and the doped regions of the first conductivity type, doped more heavily than the drift layer, are formed in the other surface portions of the drift layer, wherein the well regions are not formed.

(3) The auxiliary gate electrode is disposed above the extended portion of the drift layer of the first conductivity type extended between p-type well regions or above the doped region of the first conductivity type with the auxiliary gate insulation film interposed therebetween.

(4) The trench includes respective portions not surrounded by any well region of the second conductivity type nor by any emitter region of the first conductivity type.

(5) The ratio $W_t/W_p$ of the width $W_t$ of the trench and the width $W_p$ of the p-type well region is set at a value between 1 and 20.

These characteristic structures according to the invention contribute to increasing the accumulated carrier concentration and, therefore, to reducing the saturation voltage.

The present invention contributes not only to reducing the switching loss of the insulated gate bipolar transistors but also to reducing the power loss of the electric power conversion apparatuses.

What is claimed is:

1. A trench-type insulated gate bipolar transistor comprising:
   a drift layer of a first conductivity type;
   well regions of a second conductivity type in the surface portion of the drift layer;
   emitter regions of the first conductivity type in the respective well regions;
   trenches extending from the emitter regions to the drift layer;
   gate electrodes, each thereof being buried in each of the trenches with a gate insulation film interposed therebetween;
   an emitter electrode in common contact with the emitter regions and the well regions;
   a collector layer of the second conductivity type on the back surface of the drift layer;
   a collector electrode located on the collector layer;
   wherein the well regions are formed selectively; and
   wherein the drift layer includes extended portions that extend between the well regions.

2. The trench-type insulated gate bipolar transistor according to claim 1, further comprising auxiliary gate insulation films on the respective extended portions of the drift layer and auxiliary gate electrodes on the respective auxiliary gate insulation films.

3. The trench-type insulated gate bipolar transistor according to claim 2 wherein the gate electrodes are connected to the respective auxiliary gate electrodes.

4. The trench-type insulated gate bipolar transistor according to claim 1, wherein the trenches comprise respective portions not surrounded by any of the well regions nor by any of the emitter regions.

5. The trench-type insulated gate bipolar transistor according to claim 4, wherein the trenches are shaped with respective stripes, and the well regions are shaped with respective stripes extending in perpendicular to the stripes of the trenches.

6. The trench-type insulated gate bipolar transistor according to claim 5, wherein the stripe of the well region is divided into rectangles spaced apart from each other by the stripes of the trenches.

7. The trench-type insulated gate bipolar transistor according to claim 6, wherein the emitter regions are shaped with respective rectangles extending in parallel to the stripes of the trenches.

8. The trench-type insulated gate bipolar transistor according to claim 6, wherein the emitter regions are shaped with respective rectangles extending in perpendicular to the stripes of the trenches.

9. The trench-type insulated gate bipolar transistor according to claim 5, wherein the stripe of the trench is divided into rectangles terminated by the well regions, and the emitter regions are arranged along the short sides of the rectangular trenches.

10. A trench-type insulated gate bipolar transistor comprising:
    a drift layer of a first conductivity type;
    well regions of a second conductivity type in the surface portion of the drift layer;
    emitter regions of the first conductivity type in the respective well regions;
    trenches extending from the emitter regions to the drift layer;
    gate electrodes, each thereof being buried in each of the trenches with a gate insulation film interposed therebetween;
    an emitter electrode in common contact with the emitter regions and the well regions;
    a collector layer of the second conductivity type on the back surface of the drift layer;
    a collector electrode on the collector layer;
    wherein the well regions are formed selectively; and
    wherein the doped regions of the first conductivity type in the respective surface portions of the drift layer, where the well regions are not formed, the doped regions being doped more heavily than the drift layer.

11. The trench-type insulated gate bipolar transistor according to claim 10, wherein the surface impurity concentration of the doped regions is $1\times10^{16}$ cm$^{-3}$ or less.

12. A The trench-type insulated gate bipolar transistor according to claim 11, further comprising auxiliary gate insulation films on the respective doped regions and auxiliary gate electrodes on the respective auxiliary gate insulation films.

13. The trench-type insulated gate bipolar transistor according to claim 10, further comprising auxiliary gate insulation films on the respective doped regions and auxiliary gate electrodes on the respective auxiliary gate insulation films.

14. The trench-type insulated gate bipolar transistor according to claim 13 wherein the gate electrodes are connected to the respective auxiliary gate electrodes.

15. The trench-type insulated gate bipolar transistor according to claim 10, wherein the trenches comprise respective portions not surrounded by any of the well regions nor by any of the emitter regions.

16. The trench-type insulated gate bipolar transistor according to claim 15, wherein the trenches are shaped with respective stripes, and the well regions are shaped with respective stripes extending in perpendicular to the stripes of the trenches.

17. The trench-type insulated gate bipolar transistor according to claim 16, wherein the stripe of the well region is divided into rectangles spaced apart from each other by the stripes of the trenches.

18. The trench-type insulated gate bipolar transistor according to claim 17, wherein the emitter regions are shaped with respective rectangles extending in parallel to the stripes of the trenches.

19. The trench-type insulated gate bipolar transistor according to claim 17, wherein the emitter regions are shaped with respective rectangles extending in perpendicular to the stripes of the trenches.

20. The trench-type insulated gate bipolar transistor according to claim 16, wherein the stripe of the trench is divided into rectangles terminated by the well regions, and the emitter regions are arranged along the short sides of the rectangular trenches.

21. A trench-type insulated gate bipolar transistor comprising:
    a drift layer of a first conductivity type;
    well regions of a second conductivity type in the surface portion of the drift layer;

emitter regions of the first conductivity type in the respective well regions;

trenches extending from the emitter regions to the drift layer;

gate electrodes, each thereof being buried in each of the trenches with a gate insulation film interposed therebetween;

an emitter electrode in common contact with the emitter regions and the well regions;

a collector layer of the second conductivity type on the back surface of the drift layer;

a collector electrode on the collector layer; and wherein the ratio $W_t/W_p$ of the bottom width $W_t$ of the trench and the width $W_p$ of the well region between the trenches being set at a value between 1 and 20.

* * * * *